(12) United States Patent
He (10) Patent No.: US 7,522,899 B1
(45) Date of Patent: Apr. 21, 2009

(54) IMAGE REJECTION SCHEME FOR RECEIVERS

(75) Inventor: Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 834 days.

(21) Appl. No.: 10/891,672

(22) Filed: Jul. 15, 2004

(51) Int. Cl.
H04B 1/10 (2006.01)
(52) U.S. Cl. ........................ 455/302; 455/304; 455/323
(58) Field of Classification Search ................. None
See application file for complete search history.

(56) References Cited

U.S. PATENT DOCUMENTS 3,681,697 A * 8/1972 Moroney ................... 455/302
4,955,079 A * 9/1990 Connerney et al. .......... 455/325

* cited by examiner

Primary Examiner—Thanh C Le (57) ABSTRACT

An RF receiver image rejection scheme. The RF is received and mixed in two quadrature channels allowing separation of the undesired image portion within the RF signal from the desired portion. The two channels can be summed to allow the image portions to cancel out and form a signal which is predominantly based on the desired portion. Another sum of the two channels can also be made to provide a signal which is primarily based on the image portion. Since there are some components of the image portion even in the compensated desired signal, that signal indicative of the image portion is used to compensate for that undesired portion.

141 Claims, 9 Drawing Sheets

IMAGE REJECTION SCHEME FOR RECEIVERS

BACKGROUND

Reception of a low level RF signal often benefits from low noise and high precision operation. Noise and imprecision in such circuits has many different origins.

One common undesired signal is called an image frequency. The image signal is symmetrical to the desired frequency, relative to the local oscillator frequency.

The undesired component of the image frequency may cause image frequency interference, and this may produce undesirable content in the eventual received signal. Image frequency interference may reduce the amount of information that the channel can carry.

Different techniques have been used to reduce the effect of the image frequency interference.

SUMMARY

The present system teaches a new technique for reducing the effect of image frequency interference. One aspect defines a digital filter for a receiver. The filter can be digital or analog. The filter operates to form a first signal that mostly indicates the desired signal, and a second signal that mostly indicates the image signal, and uses the second signal to compensate the first signal.

A specific aspect describes a mixer, that has an in-phase mixer branch, forming an in-phase version of a complex signal, and a quadrature mixer branch maintaining a quadrature version of the same said complex signal, one of said branches including a phase rotator which rotates a first portion of said signal to relative to a second portion of said signal, wherein one of said first and second portions represents a desired portion of the signal and the other of said first and second portions represents an image portion of the signal; and first and second adders, where the first adder obtains a difference between said in-phase and quadrature signals to obtain a first signal which is primarily based on said first portion, and the second adder obtains a sum between said in-phase and quadrature signals to obtain a second signal which is primarily based on the second portion. A compensation part which uses one of said first and second signals to compensate the other of said first and second signals.

BRIEF DESCRIPTION OF THE DRAWINGS

These and other aspects will now be described in detail with reference to the accompanying drawings, wherein.

DETAILED DESCRIPTION

A number of different receiver topologies may be used to reduce the effect of the image signal.

Figure 1:
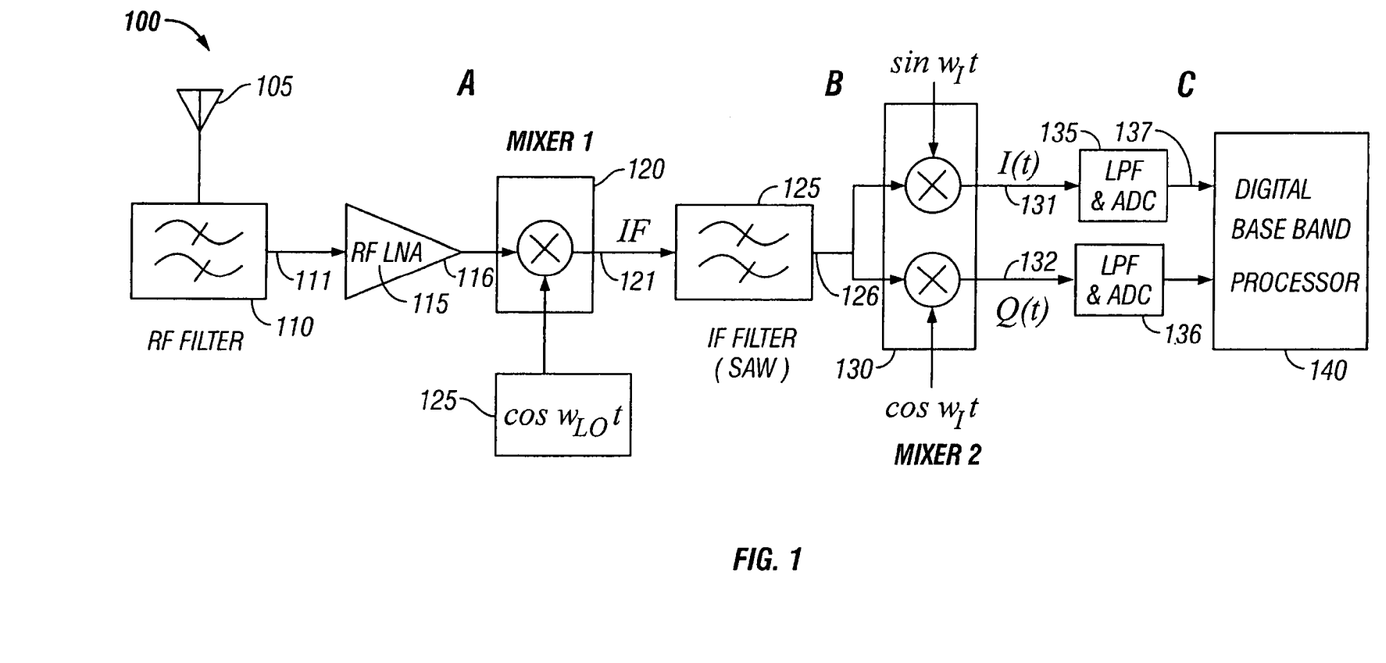
FIG. 1 shows a block diagram of a typical superheterodyne receiver using quadrature mixing.

FIG. 1 shows a block diagram of a first receiver. An RF signal 100 is received by an antenna 105. The signal is filtered by an RF filter 110, which may be, for example, a filter which allows the desired channel to pass. The filtered signal 111 is amplified by a low noise amplifier 115. The amplified signal 116 is then mixed in a mixer 120 with a local oscillator frequency from source 125. The output 121 of the mixer is applied to an IF filter 125 which may be a surface acoustic wave "SAW" device. The output 126 of the SAW filter is then mixed with sine and cosine components, to form in-phase 131 and quadrature 132 signals, in a second mixer 130. Each of the in-phase 131 and quadrature 132 signals are low pass filtered and converted to digital by respective LPF and ADC blocks 135, 136. The resultant signals are digital baseband signals 137. These signals are processed by a digital baseband processor 140.

Figure 2A:
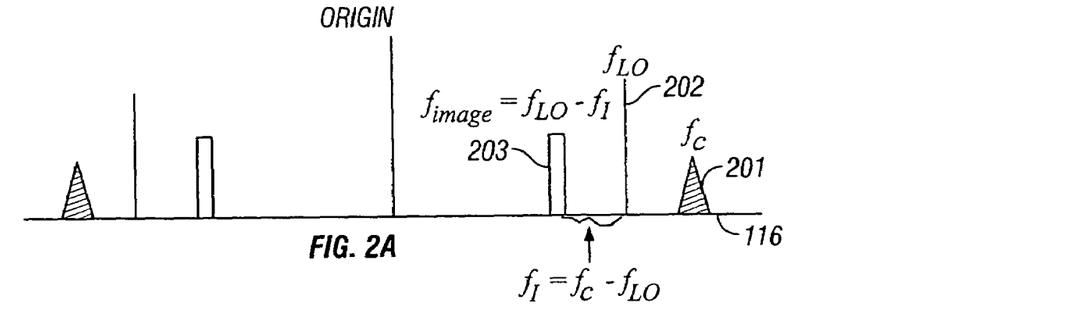
FIGS. 2A-2C show exemplary frequency domain transformations which occur in the FIG. 1 device.
Figure 2B:
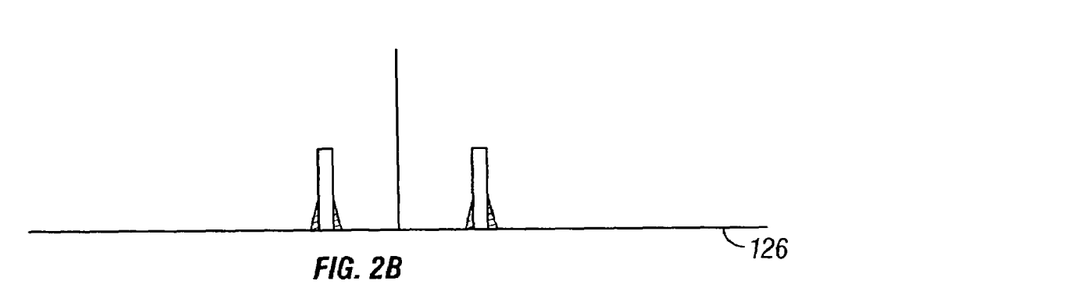
Figure 2C:
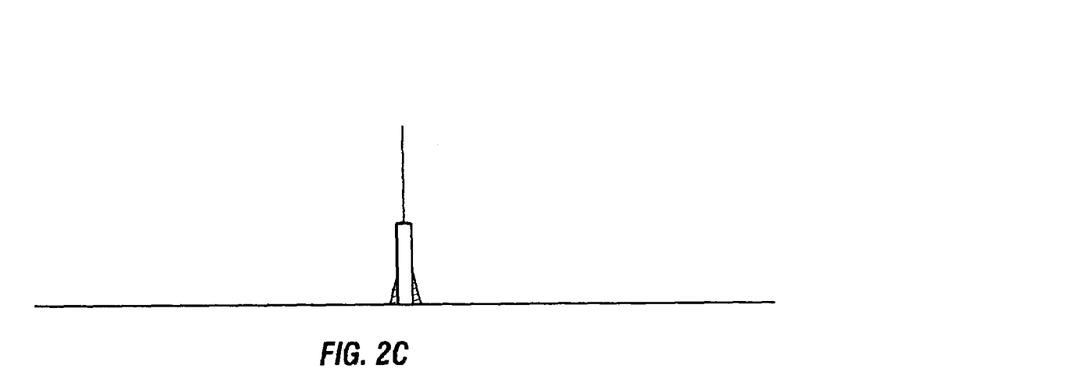

An exemplary frequency domain version of the signals is shown in FIGS. 2A-2C. FIG. 2A shows the output 116 of the low noise amplifier 115. This includes both a desired signal $f_c$ (signal 201) and its mirror image signal $f_{image}$ (signal 203), which is symmetrical to $f_c$ relative to the local oscillator frequency $f_{LO}$ (signal 202).

FIG. 2B shows how the output signal 126 from IF filter includes a combination of the desired signal $f_C$, and the image signal $f_{image}$.

FIG. 2C shows the resultant baseband-converted output signal 137, showing that this is a combination of the desired signal $f_c$ and the image signal $f_{image}$. It may be desirable to reject the image frequency to eliminate the image component from the final signal. A low pass filter may also be used to filter out adjacent channel components in FIG. 2A.

Figure 3:
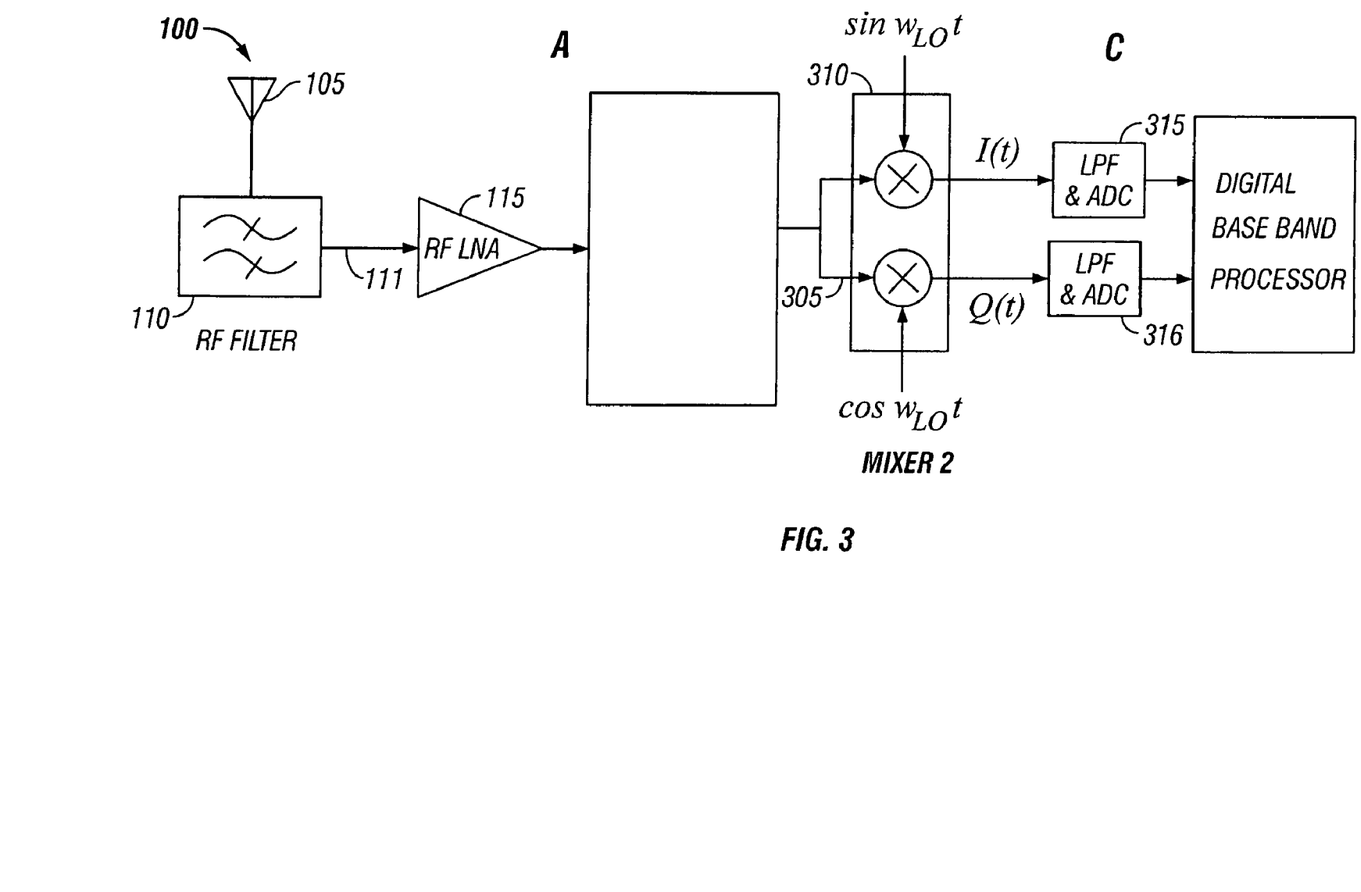
FIG. 3 shows a block diagram of a direct conversion receiver.

In certain receivers, it may be desirable to carry out more of the processing in digital, to provide the advantages of digital electronics including improved noise rejection. A block diagram of a direct conversion receiver is shown in FIG. 3. This includes the LNA 115 as in FIG. 1, but no IF stages. Instead the RF signal output 305 of the LNA is directly converted to in-phase and quadrature signals in mixer 310. These in phase and quadrature signals are each applied to respective filter and A/D converter blocks 315, 316, and are directly filtered and converted from analog to digital. No SAW filter is used in this circuit. Also, since there is no IF, no image signal is formed.

Circuit related low frequency noise and offsets exist in the direct conversion signal, e.g., based on noise and nonlinearities and/or by RF leakage added by the circuit components. Because the signal remains at relatively low frequency, it may be very difficult to distinguish the low frequency noise from the desired signal itself.

Figure 4:
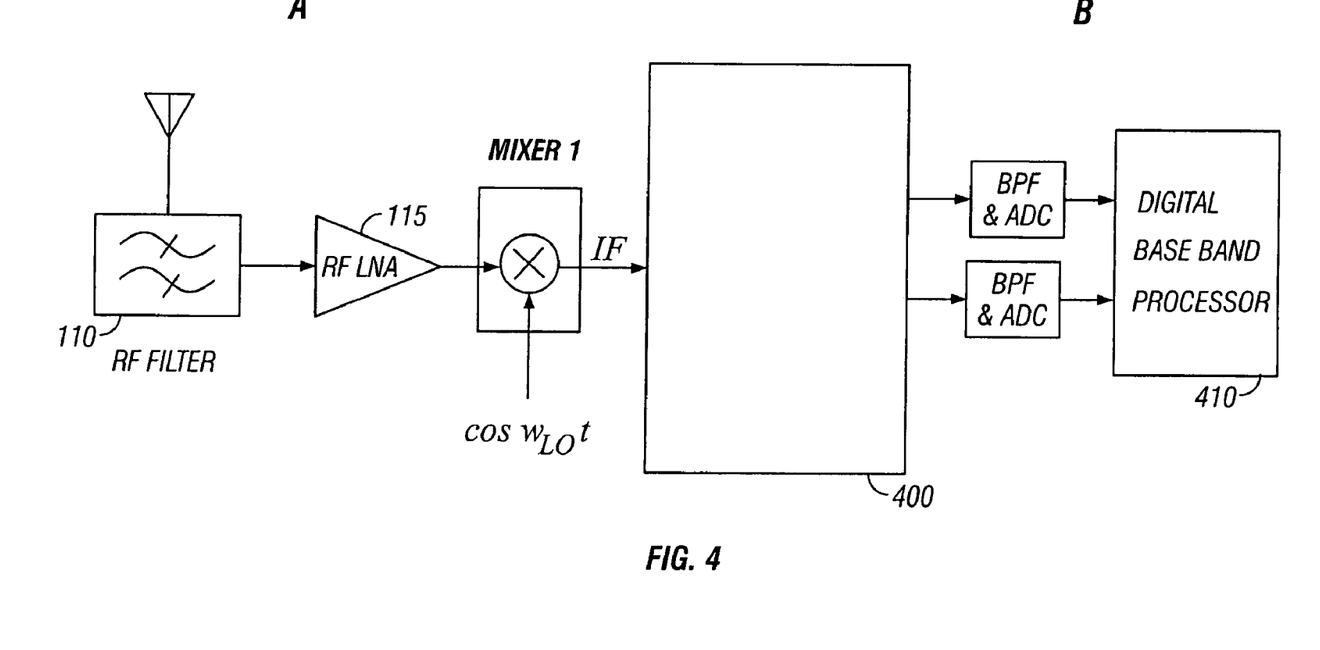
FIG. 4 shows a block diagram of a low IF conversion receiver.

FIG. 4 shows an alternative system in which low IF conversion is used. The low IF converter 400 may use similar circuitry to that described in FIG. 1, but uses a lowered frequency $f_{LO}$. This lower frequency allows the signal to be digitized directly after the IF stage. The function of the second mixer is therefore done within the baseband processor 410, in the digital domain. Since this system uses a signal spectrum that does not overlap the low frequency noise, the low frequency noise can be separated from the remaining parts of the signal, using a filter.

The IF frequency $f_I$ needs to be sufficiently low that an A/D converter can be used to digitize the IF signal. As an example, for a 2.4 GHz channel, a typical IF signal would be in range of hundreds of megahertz. A low IF signal, in contrast, would be around 40 MHz, hence reduced by approximately a decade. While this circuit allows certain processing to be done in the digital domain, the image frequency $f_{image}$ will be close to the local oscillator frequency and to the desired frequency. The value $f_I$ in FIG. 2A, representing the spacing between $f_{LO}$ and $f_{image}$, gets smaller. As $f_I$ gets small, it becomes more difficult to filter the image frequency from the desired frequency.

Figure 5:
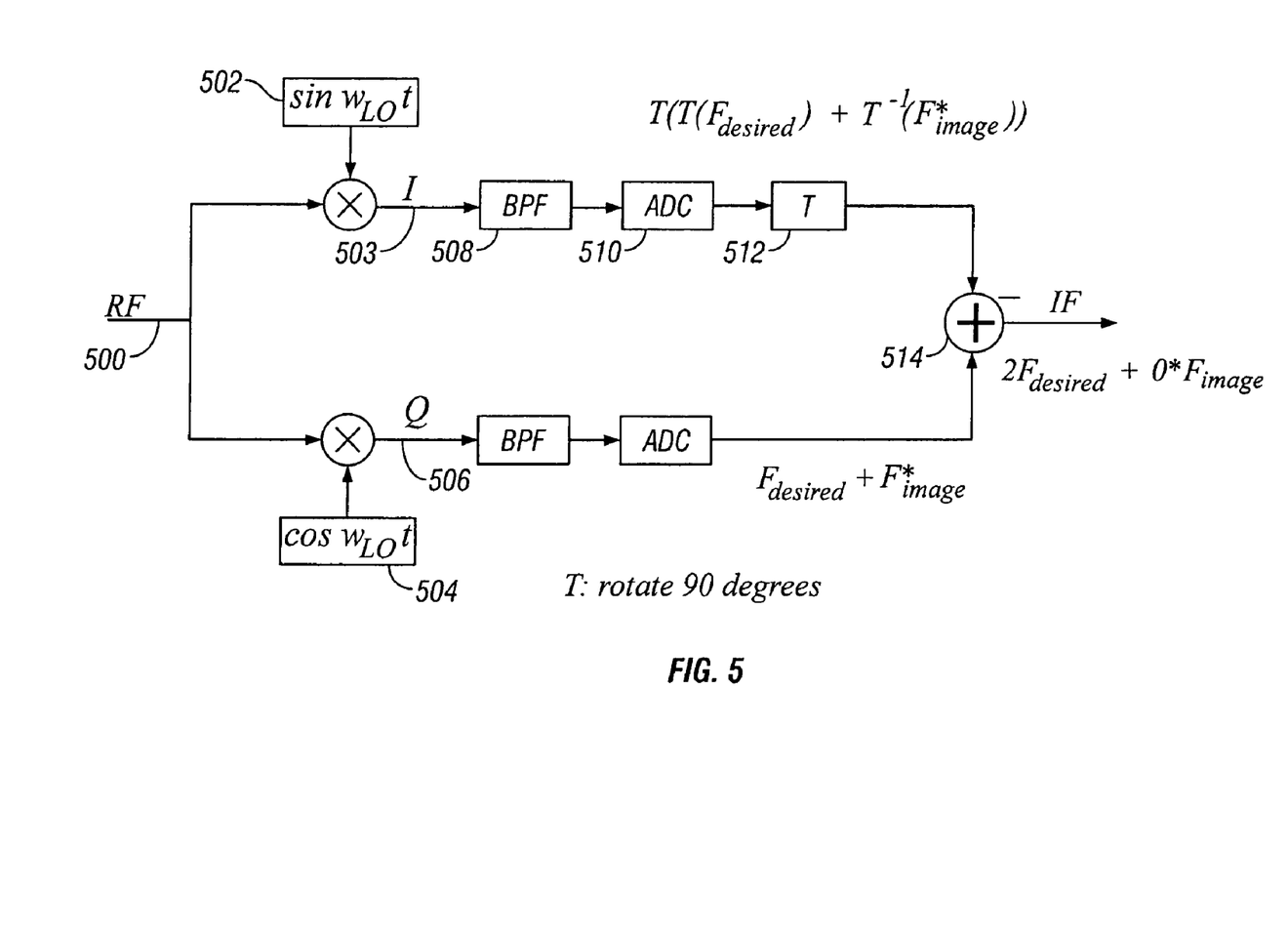
FIG. 5 shows a block diagram of an image rejection quadrature mixer.

An image rejection mixer may be used to reduce the image signal using a complex signal representation to distinguish the image signal component from the desired signal component. An image rejection mixer is shown in FIG. 5. The input RF shown as 500 is mixed with an in-phase mixing signal 502 to form an in-phase branch, and mixed with a quadrature signal 504 to form a quadrature branch 506. Each of the branches are then filtered by a bandpass filter 508 and digitized by an A/D converter 510. The quadrature branch is also rotated by 90° by a phase rotation element T, element 512. The phase rotation element can be a hardware device, which causes a 90 degree phase clockwise inversion. This forms two branches, where the first branch has an output signal $$T(T(F_{desired})+T^{-1}(F_{image}*))$$

where T represents a 90° clockwise rotation, $$=-F_{desired}+F_{image}*$$

Where $F*_{image}$ represents the conjugate of the signal, and the second branch has a signal $$F_{desired}+F_{image}*$$

The two branches are digitally summed at 514 to produce an "IF signal" that includes summed desired frequencies from both branches and cancelled image frequencies from both branches.

$$IF=2F_{desired}+0*F_{image} \quad (1)$$

Ideally, this system will reject the entire image signal ($F_{image}$). However, imperfections in the mixers, the rotator and the channels, will cause distortion. Magnitude and phase mismatches between the I and Q mixers will cause the I and Q channels to have slightly different signal handling characteristics, leading to distortion and crosstalk. Therefore, while equation (1) represents the output for a perfect channel, the actual IF output signal $$IF:\hat{F}_{desired}=W_{distort}*F_{desired}+W_{cross}*F_{image}$$

can be expressed as

Where $\hat{F}$ represents the actual value of $F_{desired}$. Defining this in terms of inverse of channel distortion (a number close to 1) gives $$IF:W_{distort}^{-1}*$$
$$\hat{F}_{desired}=F_{desired}+W_{distort}^{-1}*W_{cross}*F_{image}$$

Compensating for mismatch between the mixers can improve the performance. However, it is often not practical to remove all mismatch between the I and Q channels. Rejection of 20-30 db is typical.

Figure 6A:
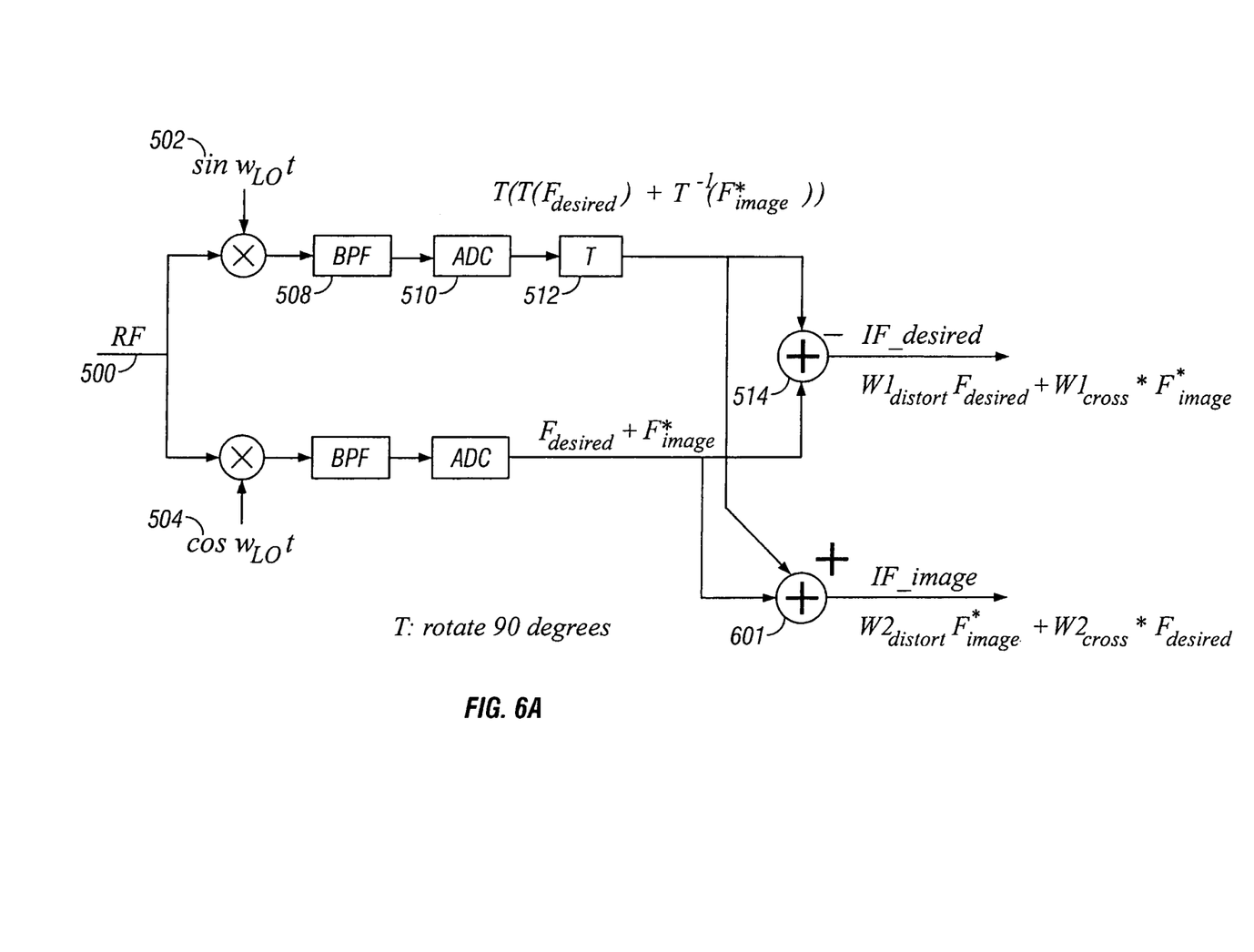
FIG. 6A shows a block diagram of an improved image rejection mixer with additional compensation signals.

FIG. 6A shows an alternative image rejection filter which can reduce errors caused by distortion and crosstalk. The filter in FIG. 5 subtracts signals to form a signal that is primarily the desired signal, but has image components also, in amounts based on imperfections in the circuit. In FIG. 6, an additional adder 601 adds the I and Q signals. The output of the adder is an additive signal, which is primarily image signal, but also includes components of the desired signal, in amounts based on circuit imperfections.

The output from the first summer 514 (I-Q) is the signal, as above $$IF_{desired}=W1_{distort}F_{desired}+W1_{cross}*F_{image}*, \quad (3)$$

where $W1_{cross} \to 0$, and $W1_{distort} \to 1$. Hence, $IF_{desired}$ represents mostly the desired signal.

The additional IF image signal from adder 601 is called $IF_{image}$, and corresponds to the signal $$\hat{F}_{image}=IF_{image}=W2_{distort}F*_{image}+W2_{cross}*F_{desired}$$

where $W2_{distort} \to 1$ and $W2_{cross} \to 0$. This signal is mostly dominated by the image component.

$W1_{distort}$; $W1_{cross}$, $W2_{distort}$ and $W2_{cross}$ can be estimated, or adaptively or otherwise determined. The value of $IF_{image}$ from equation (4) is then used, along with values of at least W1, in equation (3) to solve for a compensated version of IF desired, as:

$$IF_{desired} = \hat{F}_{desired} \approx IF_{desired} - \frac{W1_{cross}}{W2_{distort}} * IF_{image}$$

This compensated signal removes more of the undesired components.

Figure 6B:
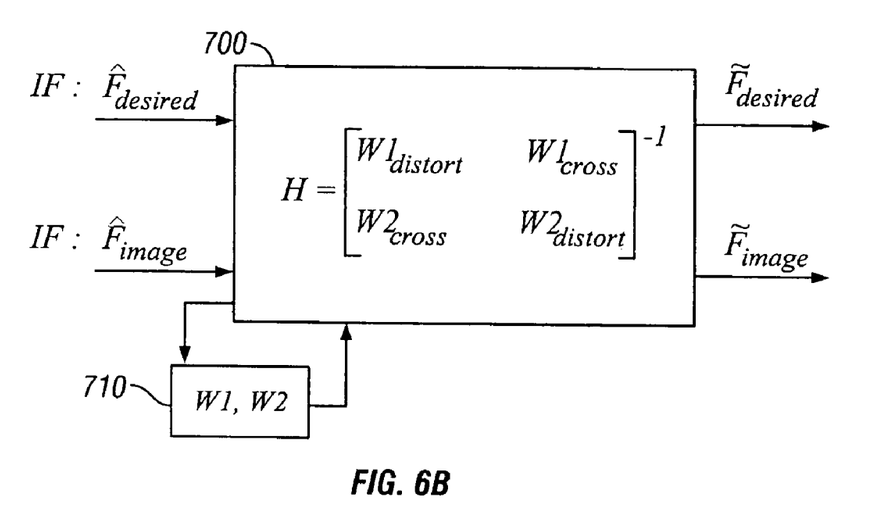
FIG. 6B shows a digital filter which can carry out the function of the improved image rejection mixer in FIG. 6A.

FIG. 6B shows this operation being done in the digital domain using an inverse matrix filter, having the transfer function:

$$H = \begin{bmatrix} W1_{distort} & W1_{cross} \\ W2_{cross} & W2_{distort} \end{bmatrix}^{-1}$$

A channel characteristic storage device 710 may be used to determine characteristics of the channel.

The uncompensated values $F_{desired}$ and $F_{image}$ are input to the filter, and the transformation is used to estimate $\hat{F}_{desired}$ and $\hat{F}_{image}$ using equations (3) and (4), and channel characteristics.

The characteristics of the channel can be found using any of a number of different techniques. A first open loop technique can be used in which the characteristics of the channel are found e.g. by calibration, and stored into the channel characteristic storage device 710.

A different open loop technique can store a table with a number of different W1 and W2 values, and select the best set of W1, W2 values on power up.

Figure 8:
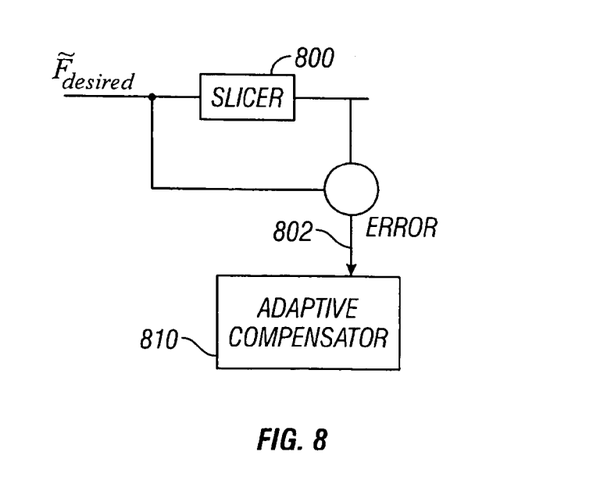
FIG. 8 shows a block diagram of an exemplary adaptive compensation device.

Alternatively, an adaptive compensation scheme can be used as shown with reference to FIG. 8. FIG. 8 shows the desired frequency being input to a slicer 800 which is a two-dimensional slicer that determines an error signal 802 between the actual signal received, and a decision made about the signal. The error signal 802 is fed back as part of the desired frequency, and also input to an adaptive compensator 810. The adaptive compensator uses a least mean squares approach to determine the channel characteristics from the calculated values.

The signals are taken as corresponding with the signals as follows:

$$\tilde{F}_{desired} = [H11 \quad H12] * \begin{bmatrix} \hat{F}_{desired} \\ \hat{F}_{image} \end{bmatrix}$$

$$\begin{bmatrix} H11(k+1) \\ H12(k+1) \end{bmatrix} = \begin{bmatrix} H11(k) \\ H12(k) \end{bmatrix} - \mu \times e(k) \times \begin{bmatrix} \hat{F}^*_{desired}(k) \\ \hat{F}^*_{image}(k) \end{bmatrix}$$

where "*" denotes conjugate e(k) is the estimated error which is e(k)=$\tilde{F}_{desired}$−(decision on $\tilde{F}_{desired}$) and feeds the error signal into that equation to find the channel characteristics.

In the equation above, H(k+1) is the adaptive compensation values for a current time, H(k) is the adaptive compensation values for a previous time, e(k) is the error signal in that previous time, μ is a scaling factor used to prevent overcompensation during any specific time interval, and is the actual received values for that previous time. The adaptive compensation scheme therefore adaptively determines the channel values and allows them to settle towards the proper values at each specific time.

No matter how determined, characteristics of the channel which are stored in the store 710.

Figure 7A:
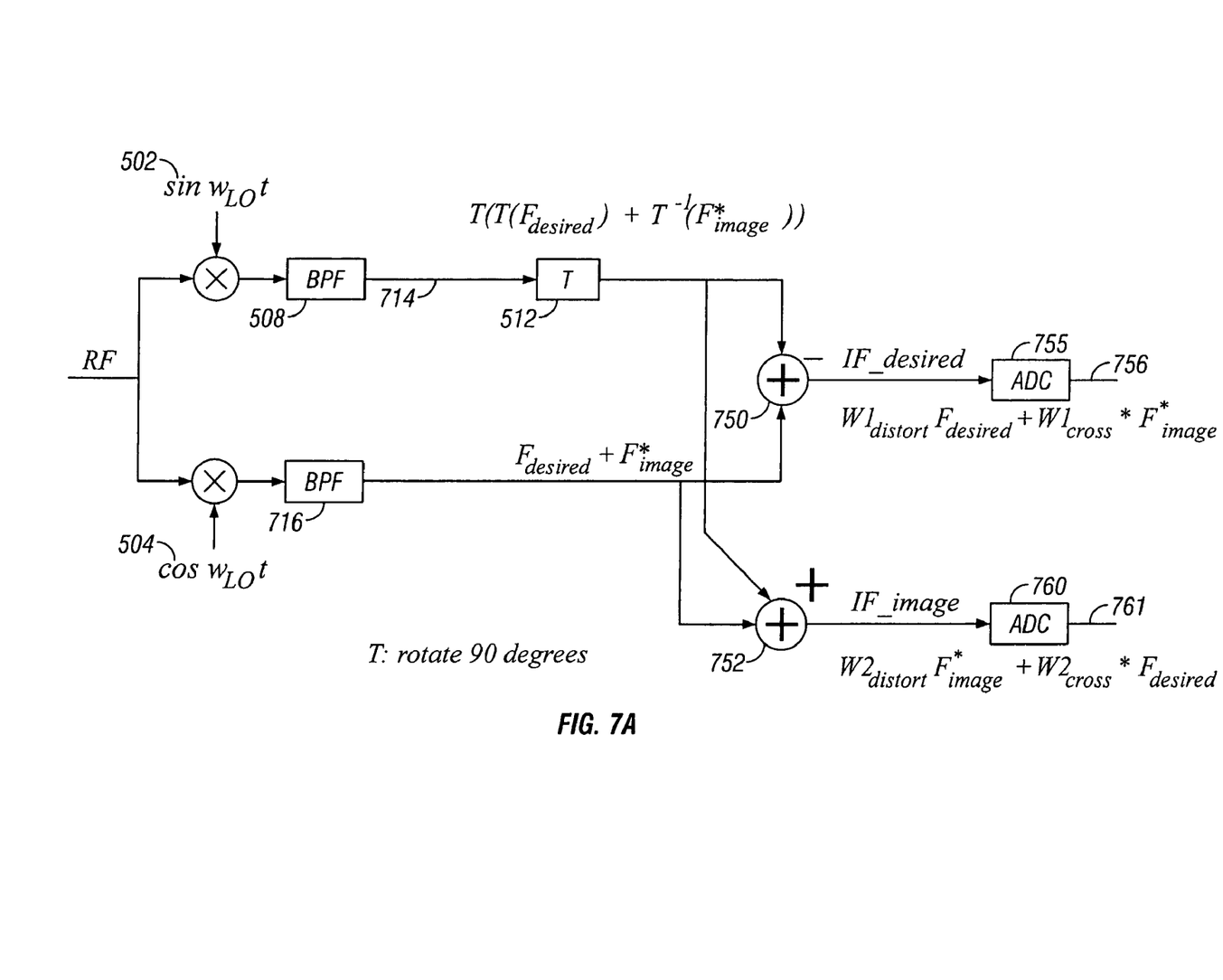
FIGS. 7A and 7B show an analog filter that operates using similar techniques to that described relative to FIGS. 6A and 6B.
Figure 7B:
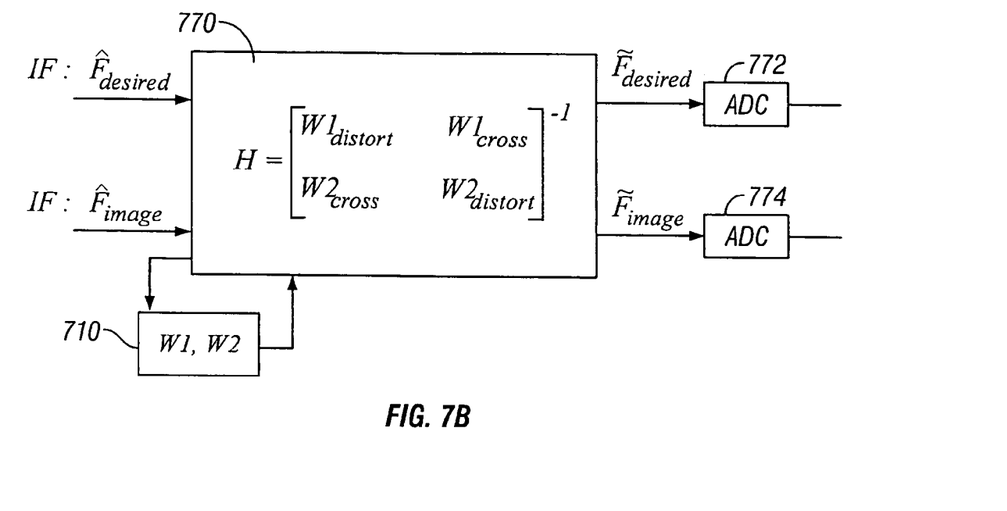

FIGS. 6A and 6B show how this filtering can be done in a digital filter. FIGS. 7A and 7B show an alternative configuration in which the filtering is done in the analog domain. In FIG. 7A, the bandpass filter 508 feeds its output signal 714 directly to the clockwise rotator device 512. Similarly, in the quadrature branch, the output of the band pass filter 716 remains in the analog domain. Therefore, in FIG. 7A, the adder 750 is actually an analog adder, which simply sums the voltages at the nodes, while the subtracter 752 is an analog subtracter that subtracts the voltages applied to the nodes. The output of the adder, representing IF$_{desired}$, is coupled to an A/D converter 755 which produces a digital output signal 756. Analogously, the IF$_{image}$ signal is coupled to an A/D converter 760 that produces an output signal 761. In FIG. 7B, the filter 770 is actually an analog filter that operates based on analog signals, and both F$_{desired}$ and F$_{image}$ are output to respective A/D converters 772, 774.

The techniques described above have described one form of compensation, but it should be understood that the same techniques can be used to carry out other compensation, using even more compensation. For example, a recursive solution of equations 3 and 4 can be carried out.

The filter described above can be embodied in a number of different ways. For example, it may be preferred to embody this filter as part of an integrated circuit on a single piece of silicon, where one or many circuits may be formed on a single silicon substrate, and other digital components used for the communication may also be formed on the substrate. In addition, however, this may be embodied as discrete components, e.g. defined using hardware definition language, or by a suitably programmed digital signal processor, or in software executed by a general purpose processor. The processor may filter the signal according to the filter transfer function shown in FIG. 7. The processor may also be configured to simulate the results of the filter, e.g., as part of a simulation program such as Matlab™.

In addition, other modifications are possible. For example, while the above describes one way of using this system as part of an image rejection mixer, it should be understood that this system can analogously be used for other kinds of noise rejection. Moreover, while this describes the compensation being done in the digital domain, it should be understood that this could also be done in the analog domain.

All such modifications are intended to be encompassed within the following claims.

What is claimed is:

1. A mixer, comprising:
an in-phase mixer branch, forming an in-phase version of a complex signal, and a quadrature mixer branch maintaining a quadrature version of the same said complex signal, one of said branches including a phase rotator which rotates a first portion of said signal relative to a second portion of said signal, wherein one of said first and second portions represents a desired portion of the signal and the other of said first and second portions represents an image portion of the signal;
first and second adders, where the first adder obtains a difference between said in-phase and quadrature signals to obtain a first signal which is primarily based on said first portion, and the second adder obtains a sum between said in-phase and quadrature signals to obtain a second signal which is primarily based on the second portion; and
a compensation part which uses one of said first and second signals to compensate the other of said first and second signals.

2. A mixer as in claim 1, further comprising a first filter in said in-phase mixer branch and a first A/D converter in said in-phase mixer branch, and a second filter in said quadrature mixer branch and a second A/D converter in said quadrature mixer branch, and wherein said phase rotator receives a digital signal.

3. A mixer as in claim 2, wherein said first and second adders are digital adders.

4. A mixer as in claim 2, wherein said compensation part includes a digital filter.

5. A mixer as in claim 2, wherein said rotator is located in said quadrature mixer branch.

6. A mixer as in claim 5, wherein said first adder produces an output which is predominantly based on the desired signal, but having a component based on the image signal, and said second adder produces an output which is predominantly based on the image signal.

7. A mixer as in claim 6, wherein said compensation part uses said output of said second adder as an estimate of the image signal, and uses said estimate to compensate for distortion in said output of said first adder.

8. A mixer as in claim 1, wherein said first adder produces an output which is predominantly based on the desired signal, but having a component based on the image signal, and said second adder produces an output which is predominantly based on the image signal, and wherein said compensation part uses said output of said second adder as an estimate of the image signal, and uses said estimate to compensate for distortion in said output of said first adder.

9. A mixer as in claim 8, further comprising a channel characteristic storage device storing specific values related to imperfections in said in phase mixer branch, and in said quadrature mixer branch.

10. A mixer as in claim 9, wherein said specific value includes at least one value indicative of distortion in the mixer branches.

11. A mixer as in claim 9, wherein said specific value includes at least one value indicative of crosstalk in the mixer branches.

12. A mixer as in claim 9, further comprising an adaptive compensation unit which determines mismatches in the mixer branches using an adaptive least mean squares approach, and stores said values in said channel characteristic storage device.

13. A mixer as in claim 9, further comprising a channel characterizer, which determines and stores information indicative of mismatches in the mixer branches in said channel characteristic storage device.

14. A mixer as in claim 1, wherein said in phase and quadrature mixing branches use analog components.

15. A mixer, comprising:
an in-phase mixer means, for forming an in-phase version of a complex signal,
a quadrature mixer means for maintaining a quadrature version of the same said complex signal,
a phase rotator means for rotating a first portion of said signal relative to a second portion of said signal, wherein one of said first and second portions represents a desired portion of the signal and the other of said first and second portions represents an image portion of the signal;
first and second adder means, where the first adder means for obtaining a difference between said in-phase and quadrature signals to obtain a first signal which is primarily based on said first portion, and the second adder means for obtaining a sum between said in-phase and quadrature signals to obtain a second signal which is primarily based on the second portion; and
a compensation means which uses one of said first and second signals for compensating the other of said first and second signals.

16. A mixer as in claim 15, further comprising a first filter means in said in-phase mixer means and a first A/D converter means in said in-phase mixer means, and a second filter means in said quadrature mixer means and a second A/D converter means in said quadrature mixer means, and wherein said phase rotator means receives a digital signal.

17. A mixer as in claim 16, wherein said first and second adder means comprise digital adders means for digitally adding said signals.

18. A mixer as in claim 16, wherein said compensation means includes a digital filter means for digitally filtering said signals.

19. A mixer as in claim 16, wherein said phase rotator means is coupled within said quadrature mixer means.

20. A mixer as in claim 19, wherein said first adder means produces an output which is predominantly based on the desired signal, but having a component based on the image signal, and said second adder means produces an output which is predominantly based on the image signal.

21. A mixer as in claim 20, wherein said compensation means is also for using said output of said second adder means as an estimate of the image signal, and uses said estimate to compensate for distortion in said output of said first adder.

22. A mixer as in claim 15, wherein said first adder means produces an output which is predominantly based on the desired signal, but having a component based on the image signal, and said second adder means produces an output which is predominantly based on the image signal, and wherein said compensation means uses said output of said second adder means as an estimate of the image signal, and uses said estimate to compensate for distortion in said output of said first adder means.

23. A mixer as in claim 22, further comprising a channel characteristic storage means storing specific values related to imperfections in said in phase mixer means, and in said quadrature mixer means.

24. A mixer as in claim 23, wherein said specific value includes at least one value indicative of distortion in the mixer means.

25. A mixer as in claim 23, wherein said specific value includes at least one value indicative of crosstalk in the mixer means.

26. A mixer as in claim 23, further comprising an adaptive compensation means which determines mismatches in the mixer means using an adaptive least mean squares approach, and stores said values in said channel characteristic storage means.

27. A mixer as in claim 23, further comprising a channel characterizer means for determining and storing information indicative of mismatches in the mixer branches in said channel characteristic storage means.

28. A mixer as in claim 15, wherein said in phase mixing means and said quadrature mixing means use analog components.

29. A method comprising:
forming an in-phase version of a complex signal;
processing said complex signal to form a quadrature version of the same said complex signal;
rotating a phase of a first portion of said signal representing a desired portion of the signal relative to a second portion of said signal representing an image portion of the signal;
obtaining a difference between said in-phase version and quadrature version to obtain a first signal which is primarily based on said first portion, and obtaining a sum between said in-phase and quadrature signals to obtain a second signal which is primarily based on the second portion; and
using one of said first and second signals to compensate the other of said first and second signals.

30. A method as in claim 29, further comprising converting said first and second signals to digital, wherein said phase rotator receives a digital signal.

31. A method as in claim 30, wherein said first signal is predominantly based on the desired signal, but having a component based on the image signal, and said second signal is predominantly based on the image signal.

32. A method as in claim 31, wherein said using uses said output of said second adder as an estimate of the image signal, and uses said estimate to compensate for distortion in said obtaining a difference.

33. A method as in claim 30, wherein said obtaining a difference comprises digitally obtaining the difference.

34. A method as in claim 30, wherein said using comprises digitally filtering at least one of said first and second signals.

35. A method as in claim 30, wherein said rotating comprises rotating the quadrature version.

36. A method as in claim 29, wherein said first signal is predominantly based on the desired signal, but has a component based on the image signal, and said second signal is predominantly based on the image signal, and wherein said using uses said second signal as an estimate of the image signal, and uses said estimate to compensate for distortion in said first signal.

37. A method as in claim 36, further comprising storing specific values related to imperfections in said in phase mixer branch, and in said quadrature mixer branch.

38. A method as in claim 37, wherein said specific value includes at least one value indicative of distortion in the mixer branches.

39. A method as in claim 37, wherein said specific value includes at least one value indicative of crosstalk in the mixer branches.

40. A method as in claim 37, further comprising determining mismatches in the mixer branches using an adaptive least mean squares approach, and storing said values in said channel characteristic storage device.

41. A method as in claim 37, further comprising determining and storing information indicative of mismatches in the mixer branches in said channel characteristic storage device.

42. A method as in claim 29, wherein said forming and obtaining in are done in analog.

43. A mixer, comprising:
a first mixing part which mixes an input RF signal with a first local oscillator component to produce a first mixed component;
a second mixing part which mixes the input RF signal with a second local oscillator component, which second local oscillator component is substantially orthogonal to said first local oscillator component, to produce a second mixed component;
a phase rotating part, which changes a phase of one of said first mixed component and said second mixed component, relative to the other;
sum and difference parts, which combine said first and second mixed components to obtain a first signal that is predominantly based on the desired signal, and a second signal that is predominantly based on an image signal; and
a filter which uses said second signal to compensate for distortion and to correct said first signal, wherein said filter is a digital filter that computes:

$$H = \begin{bmatrix} W^1_{distort} & W^1_{cross} \\ W^2_{cross} & W^2_{distort} \end{bmatrix}$$

where $W1_{distort}$ and $W1_{cross}$ respectively represent crosstalk and distortion in a path of said first mixing component, and $W2_{distort}$ and $W2_{cross}$ respectively represent crosstalk and distortion in a path of said second mixing component.

44. A mixer as in claim 43, further comprising a channel storage unit, which stores information indicative of distortion in the channel as coefficients thereof, and where said coefficients are used by said filter.

45. A mixer as in claim 44, further comprising a least mean squares, adaptive compensation unit, which computes said coefficients.

46. A mixer comprising:
a first mixing means which mixes an input RF signal with a first local oscillator component to produce a first mixed component;
a second mixing means which mixes the input RF signal with a second local oscillator component which second local oscillator component is substantially orthogonal to said first local oscillator component to produce a second mixed component;
a phase rotating means, which changes a phase of one of said first mixed component and said second mixed component, relative to the other;
sum and difference means, which combine said first and second mixed components to obtain a first signal that is predominantly based on the desired signal and a second signal that is predominantly based on an image signal; and
a filter means which uses said second signal for compensating distortion and for correcting said first signal wherein said filter means is a digital filter means for digitally filtering said signals and for computing:

$$H = \begin{bmatrix} W^1_{distort} & W^1_{cross} \\ W^2_{cross} & W^2_{distort} \end{bmatrix}$$

where $W1_{distort}$ and $W1_{cross}$ respectively represent crosstalk and distortion in a path of said first mixing component, and $W2_{distort}$ and $W2_{cross}$ respectively represent crosstalk and distortion in a path of said second mixing component.

47. A mixer as in claim 46, further comprising a channel storage means for storing, information indicative of distortion in the channel as coefficients thereof, and where said coefficients are used by said filter means.

48. A mixer as in claim 47, further comprising a least mean squares, adaptive compensation means, for computing said coefficients.

49. An RF circuit, comprising:
a first mixer mixing an input RF signal with a sine component to produce a first mixed component;
a second mixer mixing the input RF signal with a cosine component to produce a second mixed component that is orthogonal to said first mixed component;
a phase rotator that rotates a phase of one of said first mixed component and said second mixed component, relative to the other;
a first adder combining said first and second mixed components to obtain a first signal that is predominantly based on the desired signal, and
a second adder, obtaining a difference between said first and second mixed components to obtain a second signal that is predominantly based on an image signal.

50. A circuit as in claim 49, further comprising a first filter and a first A/D converter coupled to receive the first mixed component and a second filter in said quadrature mixer branch and a second A/D converter coupled to receive the second mixed component, and wherein said phase rotator receives a digital signal.

51. A circuit as in claim 49, wherein said first and second adders are digital adders.

52. A circuit as in claim 49, wherein said first adder produces an output which is predominantly based on the desired signal, but having a component based on the image signal, and said second adder produces an output which is predominantly based on the image signal.

53. A circuit as in claim 52, comprising a compensation part using said output of said second adder as an estimate of the image signal, and uses said estimate to compensate for distortion in said output of said first adder.

54. A circuit as in claim 49, further comprising a channel characteristic storage device storing specific values related to imperfections in said first and second mixers.

55. A circuit as in claim 54, wherein said specific value includes at least one value indicative of distortion in the mixers.

56. A circuit as in claim 54, wherein said specific value includes at least one value indicative of crosstalk in the mixer branches.

57. A circuit as in claim 54, further comprising an adaptive compensation unit which determines mismatches in the mixers using an adaptive least mean squares approach, and stores said values in said channel characteristic storage device.

58. A circuit as in claim 54, further comprising a channel characterizer, which determines and stores information indicative of mismatches in the mixer branches in said channel characteristic storage device.

59. A circuit as in claim 49, wherein said first and second mixers use analog components.

60. A method, comprising:
first mixing an input RF signal with a sine component to produce a first mixed component;
second mixing the input RF signal with a cosine component to produce a second mixed component that is orthogonal to said first mixed component;
rotating a phase of one of said first mixed component and said second mixed component, relative to the other;
combining said first and second mixed components to obtain a first signal that is predominantly based on the desired signal, and
obtaining a difference between said first and second mixed components to obtain a second signal that is predominantly based on an image signal.

61. A method as in claim 60, wherein said first mixing includes a filter and a first A/D converter coupled to receive the first mixed component, and said second mixing includes a second filter and a second A/D converter coupled to receive the second mixed component, and wherein said phase rotating rotates a digital signal.

62. A method as in claim 60, wherein said combining and said obtaining a difference, each use digital components.

63. A method as in claim 60, wherein said combining produces an output which is predominantly based on the desired signal, but having a component based on the image signal, and said second adder produces an output which is predominantly based on the image signal.

64. A method as in claim 63, further comprising using said second signal as an estimate of the image signal, and using said estimate to compensate for distortion in said first signal.

65. A method as in claim 60, further comprising storing specific values related to imperfections in said first and second mixing.

66. A method as in claim 65, wherein said specific value includes at least one value indicative of distortion in the first and second mixing.

67. A method as in claim 65, wherein said specific value includes at least one value indicative of crosstalk in the mixing.

68. A method as in claim 65, further comprising determining mismatches in the mixing using an adaptive least mean squares approach, and store values indicative thereof.

69. A method as in claim 60, further comprising a channel characterizer, which determines and stores information indicative of mismatches in the mixer branches in said channel characteristic storage device.

70. A method as in claim 60, wherein said first and second mixing uses analog components.

71. A method comprising:
receiving an RF signal and producing a representation indicative thereof;
mixing said representation with a sine signal to produce a first mixed component, and with a cosine signal to produce a second mixed component which is in-phase quadrature with said first mixed component;
changing a phase of at least part of the signal representing one of said mixed components to provide a phase rotated component;
combining at least one of said first and second mixed components with said phase rotated component to obtain a first signal that is predominantly based on the desired signal, and a second signal that is predominantly based on an image signal; and
filtering using said second signal to compensate for distortion and to correct said first signal wherein said filtering comprises digitally filtering and computing $$H = \begin{bmatrix} W^1_{distort} & W^1_{cross} \\ W^2_{cross} & W^2_{distort} \end{bmatrix}$$

where $W1_{distort}$ and $W1_{cross}$ respectively represent crosstalk and distortion in a first path of said first mixing component, and $W2_{distort}$ and $W2_{cross}$ respectively represent crosstalk and distortion in a second path.

72. A method as in claim 71, further comprising storing information indicative of distortion in the channel as coefficients, and using said coefficients for said filtering.

73. A method as in claim 72, further comprising using least means squares adaptive compensation to compute said coefficients.

74. A system comprising:
a receiver, receiving an RF signal and producing a representation indicative thereof;
a mixer, mixing said representation with a first signal to produce a first mixed component, and with a second signal to produce a second mixed component which is in-phase quadrature with said first mixed component;
a phase rotator, changing a phase of at least part of the signal representing one of said mixed components to provide a phase rotated component;
an adder, combining at least one of said first and second mixed components with said phase rotated component, to obtain a first signal that is predominantly based on the desired signal, and a second signal that is predominantly based on an image signal; and
a filter which uses said second signal to compensate for distortion and to correct said first signal wherein said filter is a digital filter that computes:

$$H = \begin{bmatrix} W^1_{distort} & W^1_{cross} \\ W^2_{cross} & W^2_{distort} \end{bmatrix}$$

where $W1_{distort}$ and $W1_{cross}$ respectively represent crosstalk and distortion in a path of said first mixed component, and $W2_{distort}$ and $W2_{cross}$ respectively represent crosstalk and distortion in a path of said second mixed component.

75. A system as in claim 74, further comprising a channel storage unit, which stores information indicative of distortion in the channel as coefficients thereof, and where said coefficients are used by said filter.

76. A system as in claim 75, further comprising a least mean squares, adaptive compensation unit, which computes said coefficients.

77. An RF circuit, comprising:
first mixer means for mixing an input RF signal with a sine component to produce a first mixed component;
second mixer means for mixing the input RF signal with a cosine component to produce a second mixed component that is orthogonal to said first mixed component;
phase rotator means for rotating a phase of one of said first mixed component and said second mixed component, relative to the other;

first adder means for combining said first and second mixed components to obtain a first signal that is predominantly based on the desired signal, and second adder means for obtaining a difference between said first and second mixed components to obtain a second signal that is predominantly based on an image signal.

78. A circuit as in claim 77, further comprising a first filter means for filtering the first mixed component and a first A/D converter means for A/D converting the first mixed component, and a second filter means for filtering said second mixed component in said quadrature mixer branch and a second A/D converter means for A/D converting the second mixed component, and wherein said phase rotator means receives a digital signal.

79. A circuit as in claim 77, wherein said first and second adder means are digital adder means for digitally adding signals.

80. A circuit as in claim 77, wherein said first adder means produces an output which is predominantly based on the desired signal, but having a component based on the image signal, and said second adder means produces an output which is predominantly based on the image signal.

81. A circuit as in claim 80, further comprising a compensation means for using said output of said second adder means as an estimate of the image signal, and for using said estimate to compensate for distortion in said output of said first adder means.

82. A circuit as in claim 77, further comprising a channel characteristic storage means storing specific values related to imperfections in said first and second mixer means.

83. A circuit as in claim 82, wherein said specific value includes at least one value indicative of distortion in the mixer means.

84. A circuit as in claim 82, wherein said specific value includes at least one value indicative of crosstalk in the mixer branches.

85. A circuit as in claim 82, further comprising an adaptive compensation means which determines mismatches in the mixer means using an adaptive least mean squares approach, and stores said values in said channel characteristic storage means.

86. A circuit as in claim 82, further comprising a channel characterizer means, which determines and stores information indicative of mismatches in the mixer branches in said channel characteristic storage means.

87. A circuit as in claim 77, wherein said first and second mixer means use analog components.

88. An RF system, comprising:
a first mixer mixing an input RF signal with a sine component to produce a first mixed component;
a second mixer mixing the input RF signal with a cosine component to produce a second mixed component that is orthogonal to said first mixed component;
a phase rotator that rotates a phase of one of said first mixed component and said second mixed component, relative to the other;
a first adder combining said first and second mixed components to obtain a first signal that is predominantly based on the desired signal,
a second adder, obtaining a difference between said first and second mixed components to obtain a second signal that is predominantly based on an image signal, and
a signal output device which produces an output based on both said first signal and said second signal.

89. A system as in claim 88, further comprising a first filter and a first A/D converter coupled to receive the first mixed component and a second filter in said quadrature mixer branch and a second A/D converter coupled to receive the second mixed component, and wherein said phase rotator receives a digital signal.

90. A system as in claim 88, wherein said first and second adders are digital adders.

91. A system as in claim 88, wherein said first adder produces an output which is predominantly based on the desired signal, but having a component based on the image signal, and said second adder produces an output which is predominantly based on the image signal.

92. A system as in claim 91, further comprising a compensation part using said output of said second adder as an estimate of the image signal, and uses said estimate to compensate for distortion in said output of said first adder.

93. A system as in claim 88, further comprising a channel characteristic storage device storing specific values related to imperfections in said first and second mixers.

94. A system as in claim 93, wherein said specific value includes at least one value indicative of distortion in the mixers.

95. A system as in claim 93, wherein said specific value includes at least one value indicative of crosstalk in the mixer branches.

96. A system as in claim 93, further comprising an adaptive compensation unit which determines mismatches in the mixers using an adaptive least mean squares approach, and stores said values in said channel characteristic storage device.

97. A system, as in claim 93, further comprising a channel characterizer, which determines and stores information indicative of mismatches in the mixer branches in said channel characteristic storage device.

98. A system as in claim 88, wherein said first and second mixers use analog components.

99. A system comprising:
first mixing means for mixing an input RF signal with a sine component to produce a first mixed component;
second mixing means for mixing the input RF signal with a cosine component to produce a second mixed component that is orthogonal to said first mixed component;
means for rotating a phase of one of said first mixed component and said second mixed component, relative to the other;
summing means for combining said first and second mixed components to obtain a first signal that is predominantly based on the desired signal, and
difference means for obtaining a difference between said first and second mixed components to obtain a second signal that is predominantly based on an image signal, wherein said first and second adder means are digital adder means for digitally adding signals.

100. A system comprising:
first mixing means for mixing an input RF signal with a sine component to produce a first mixed component;
second mixing means for mixing the input RF signal with a cosine component to produce a second mixed component that is orthogonal to said first mixed component;
means for rotating a phase of one of said first mixed component and said second mixed component, relative to the other;
summing means for combining said first and second mixed components to obtain a first signal that is predominantly based on the desired signal, and
difference means for obtaining a difference between said first and second mixed components to obtain a second signal that is predominantly based on an image signal, wherein said first adder means produces an output which is predominantly based on the desired signal, but having a component based on the image signal, and said second adder means produces an output which is predominantly based on the image signal.

101. A system as in claim 100, further comprising a compensation means for using said output of said second adder means as an estimate of the image signal, and for using said estimate to compensate for distortion in said output of said first adder means.

102. A system comprising:
first mixing means for mixing an input RF signal with a sine component to produce a first mixed component;
second mixing means for mixing the input RF signal with a cosine component to produce a second mixed component that is orthogonal to said first mixed component;
means for rotating a phase of one of said first mixed component and said second mixed component, relative to the other;
summing means for combining said first and second mixed components to obtain a first signal that is predominantly based on the desired signal;
difference means for obtaining a difference between said first and second mixed components to obtain a second signal that is predominantly based on an image signal; and
a channel characteristic storage means storing specific values related to imperfections in said first and second mixer means.

103. A system as in claim 102, wherein said specific value includes at least one value indicative of distortion in the mixer means.

104. A system as in claim 102, wherein said specific value includes at least one value indicative of crosstalk in the mixer branches.

105. A system as in claim 102, further comprising an adaptive compensation means which determines mismatches in the mixer means using an adaptive least mean squares approach, and stores said values in said channel characteristic storage means.

106. A system as in claim 102, further comprising a channel characterizer means, which determines and stores information indicative of mismatches in the mixer branches in said channel characteristic storage means.

107. A system comprising:
first mixing means for mixing an input RF signal with a sine component to produce a first mixed component;
second mixing means for mixing the input RF signal with a cosine component to produce a second mixed component that is orthogonal to said first mixed component;
means for rotating a phase of one of said first mixed component and said second mixed component, relative to the other;
summing means for combining said first and second mixed components to obtain a first signal that is predominantly based on the desired signal, and
difference means for obtaining a difference between said first and second mixed components to obtain a second signal that is predominantly based on an image signal wherein said first and second mixing means use analog components.

108. An RF system, comprising:
first mixer means for mixing an input RF signal with a sine component to produce a first mixed component;
second mixer means for mixing the input RF signal with a cosine component to produce a second mixed component that is orthogonal to said first mixed component;
phase rotator means for rotating a phase of one of said first mixed component and said second mixed component, relative to the other;
first adder means for combining said first and second mixed components to obtain a first signal that is predominantly based on the desired signal,
second adder means for obtaining a difference between said first and second mixed components to obtain a second signal that is predominantly based on an image signal, and
signal output means for producing an output based on both said first signal and said second signal.

109. A system as in claim 108, further comprising a filter means for using said second signal to compensate for distortion and to correct said first signal.

110. A system as in claim 109, wherein said filter means is a digital filter means for digitally filtering.

111. A system as in claim 110, wherein said filter means is a digital filter means for computing:

$$H = \begin{bmatrix} W^1_{distort} & W^1_{cross} \\ W^2_{cross} & W^2_{distort} \end{bmatrix}$$

where $W1_{distort}$ and $W1_{cross}$ respectively represent crosstalk and distortion in a path of said first mixed component, and $W2_{distort}$ and $W2_{cross}$ respectively represent crosstalk and distortion in a path of said second mixed component.

112. A system as in claim 109, further comprising a channel storage means for storing information indicative of distortion in the channel as coefficients thereof, and where said coefficients are used by said filter means.

113. A system as in claim 112, further comprising a least mean squares, adaptive compensation means for computing said coefficients.

114. A mixer system, comprising:
an in-phase mixer branch, forming an in-phase version of a complex signal, and a quadrature mixer branch maintaining a quadrature version of the same said complex signal, one of said branches including a phase rotator which rotates a first portion of said signal relative to a second portion of said signal, wherein one of said first and second portions represents a desired portion of the signal and the other of said first and second portions represents an image portion of the signal;
first and second adders, where the first adder obtains a difference between said in-phase and quadrature signals to obtain a first signal which is primarily based on said first portion, and the second adder obtains a sum between said in-phase and quadrature signals to obtain a second signal which is primarily based on the second portion; and
a compensation part which uses one of said first and second signals to compensate the other of said first and second signals to produce a compensated signal output based on said complex signal.

115. A system as in claim 114, further comprising a first filter in said in-phase system branch and a first A/D converter in said in-phase system branch, and a second filter in said quadrature system branch and a second A/D converter in said quadrature system branch, and wherein said phase rotator receives a digital signal.

116. A system as in claim 115, wherein said first and second adders are digital adders.

117. A system as in claim 115, wherein said compensation part includes a digital filter.

118. A system as in claim 115, wherein said rotator is located in said quadrature mixer branch.

119. A system as in claim 118, wherein said first adder produces an output which is predominantly based on the desired signal, but having a component based on the image signal, and said second adder produces an output which is predominantly based on the image signal.

120. A system as in claim 119, wherein said compensation part uses said output of said second adder as an estimate of the image signal, and uses said estimate to compensate for distortion in said output of said first adder.

121. A system as in claim 114, wherein said first adder produces an output which is predominantly based on the desired signal, but having a component based on the image signal, and said second adder produces an output which is predominantly based on the image signal, and wherein said compensation part uses said output of said second adder as an estimate of the image signal, and uses said estimate to compensate for distortion in said output of said first adder.

122. A system as in claim 121, further comprising a channel characteristic storage device storing specific values related to imperfections in said in phase mixer branch, and in said quadrature mixer branch.

123. A system as in claim 122, wherein said specific value includes at least one value indicative of distortion in the mixer branches.

124. A system as in claim 123, wherein said specific value includes at least one value indicative of crosstalk in the mixer branches.

125. A system as in claim 122, further comprising an adaptive compensation unit which determines mismatches in the mixer branches using an adaptive least mean squares approach, and stores said values in said channel characteristic storage device.

126. A system as in claim 122, further comprising a channel characterizer, which determines and stores information indicative of mismatches in the mixer branches in said channel characteristic storage device.

127. A system as in claim 114, wherein said in phase and quadrature mixing branches use analog components.

128. A mixer system, comprising:
first means for forming an in-phase version of a complex signal, and second means for maintaining a quadrature version of the same said complex signal, one of said first and second means including a phase rotator means which rotates a first portion of said signal relative to a second portion of said signal, wherein one of said first and second portions represents a desired portion of the signal and the other of said first and second portions represents an image portion of the signal;
first and second adder means, where the first adder means obtains a difference between said in-phase and quadrature signals to obtain a first signal which is primarily based on said first portion, and the second adder means obtains a sum between said in-phase and quadrature signals to obtain a second signal which is primarily based on the second portion; and
a compensation means for using one of said first and second signals to compensate the other of said first and second signals to produce a compensated signal output based on said complex signal.

129. A system as in claim 128, further comprising a first filter means associated with said first means and a first A/D converter means associated with said first means, and a second filter means associated with said second means and a second A/D converter means associated with said second, and wherein said phase rotator means receives a digital signal.

130. A system as in claim 129, wherein said first and second adder means are digital adder means for digitally adding digital signals.

131. A system as in claim 129, wherein said compensation means includes a digital filter means for digitally filtering signals.

132. A system as in claim 129, wherein said rotator means is associated with said second means.

133. A system as in claim 132, wherein said first adder means is also for producing an output which is predominantly based on the desired signal, but having a component based on the image signal, and said second adder means is for producing an output which is predominantly based on the image signal.

134. A system as in claim 133, wherein said compensation means uses said output of said second adder means as an estimate of the image signal, and uses said estimate to compensate for distortion in said output of said first adder means.

135. A system as in claim 128, wherein said first adder means is also for producing an output which is predominantly based on the desired signal, but having a component based on the image signal, and said second adder means is also for producing an output which is predominantly based on the image signal, and wherein said compensation means is also for using said output of said second adder means as an estimate of the image signal, and using said estimate to compensate for distortion in said output of said first adder means.

136. A system as in claim 135, further comprising a channel characteristic storage means for storing specific values related to imperfections in said first means and in said second means.

137. A system as in claim 136, wherein said specific value includes at least one value indicative of distortion in the first means and said second means.

138. A system as in claim 136, wherein said specific value includes at least one value indicative of crosstalk in the first means and said second means.

139. A system as in claim 136, further comprising an adaptive compensation means for determining mismatches in the first and second means using an adaptive least mean squares approach, and stores said values in said channel characteristic storage means.

140. A system as in claim 136, further comprising a channel characterizer means for determining and storing information indicative of mismatches in the first and second means in said channel characteristic storage means.

141. A system as in claim 128, wherein said first and second means use analog components.

* * * * *